United States Patent
Elliot et al.

(10) Patent No.: US 11,183,412 B2
(45) Date of Patent: Nov. 23, 2021

(54) METHOD FOR JOINING QUARTZ PIECES AND QUARTZ ELECTRODES AND OTHER DEVICES OF JOINED QUARTZ

(71) Applicant: Watlow Electric Manufacturing Company, St. Louis, MO (US)

(72) Inventors: Brent Elliot, Cupertino, CA (US); Guleid Hussen, San Francisco, CA (US); Jason Stephens, San Francisco, CA (US); Michael Parker, Brentwood, CA (US)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 342 days.

(21) Appl. No.: 16/102,737

(22) Filed: Aug. 14, 2018

(65) Prior Publication Data
US 2019/0109033 A1 Apr. 11, 2019

Related U.S. Application Data

(60) Provisional application No. 62/545,472, filed on Aug. 14, 2017.

(51) Int. Cl.
*B32B 15/04* (2006.01)
*H01L 21/683* (2006.01)
(Continued)

(52) U.S. Cl.
CPC .......... *H01L 21/6833* (2013.01); *B32B 9/005* (2013.01); *B32B 9/041* (2013.01);
(Continued)

(58) Field of Classification Search
CPC ....... B32B 15/04; B32B 17/06; B32B 17/061; B32B 2457/00
(Continued)

(56) References Cited

U.S. PATENT DOCUMENTS 9,546,918 B2 * 1/2017 Mizushima ............ B25J 19/028
2009/0151848 A1 * 6/2009 Werdecker .............. C03C 27/06
156/62.2
(Continued)

FOREIGN PATENT DOCUMENTS

CN 102514346 9/2008
DE 2923011 3/1980
(Continued)

OTHER PUBLICATIONS

International Search Report for International Application PCT/US2018/046788, dated Dec. 21, 2018.
(Continued)

*Primary Examiner* — Lauren R Colgan
(74) *Attorney, Agent, or Firm* — Burris Law, PLLC

(57) ABSTRACT

A method for joining quartz pieces using metallic aluminum as the joining element. The aluminum may be placed between two quartz pieces and the assembly may be heated in the range of 500 C to 650 C. The joining atmosphere may be non-oxygenated. A method for the joining of quartz pieces which may include barrier layers on the quartz pieces. The barrier layers may be impervious to aluminum diffusion and may be of a metal oxide or metal nitride. The quartz pieces with the barrier layers may then be joined at temperatures higher than 650 C and less than 1200 C. A device such as an RF antenna or electrode in support of semiconductor processing using joined quartz pieces wherein the aluminum joining layer which has joined the pieces and also functions as antenna electrode.

20 Claims, 5 Drawing Sheets

(51) Int. Cl.
    *H01L 21/687*     (2006.01)
    *B32B 17/06*     (2006.01)
    *B32B 9/00*     (2006.01)
    *B32B 9/04*     (2006.01)
    *B32B 37/04*     (2006.01)
    *H01J 37/32*     (2006.01)

(52) U.S. Cl.
    CPC ............ *B32B 15/04* (2013.01); *B32B 17/061* (2013.01); *B32B 37/04* (2013.01); *H01J 37/3255* (2013.01); *H01J 37/32577* (2013.01); *H01J 37/32715* (2013.01); *H01L 21/68757* (2013.01); *H01L 21/68785* (2013.01); *B32B 2311/24* (2013.01); *B32B 2318/00* (2013.01); *B32B 2457/00* (2013.01)

(58) Field of Classification Search
    USPC .................................. 428/426, 428, 432, 433
    See application file for complete search history.

(56) References Cited

U.S. PATENT DOCUMENTS

| | | | | |
|---|---|---|---|---|
| 2014/0319684 | A1* | 10/2014 | Suzuki | H01L 23/64 |
| | | | | 257/746 |
| 2017/0215270 | A1* | 7/2017 | Hawtof | H01Q 9/04 |
| 2020/0089043 | A1* | 3/2020 | Moriwaki | G03B 21/006 |

FOREIGN PATENT DOCUMENTS

| | | | |
|---|---|---|---|
| JP | 2000281459 | * | 10/2000 |
| JP | 2011219352 | | 11/2011 |

OTHER PUBLICATIONS

Written Opinion of the International Searching Authority for International Application PCT/US2018/046788, dated Dec. 21, 2018.

\* cited by examiner

METHOD FOR JOINING QUARTZ PIECES AND QUARTZ ELECTRODES AND OTHER DEVICES OF JOINED QUARTZ

CROSS-REFERENCE TO RELATED APPLICATIONS

This application claims priority to U.S. Provisional Patent Application No. 62/545,472 to Elliot et al., filed Aug. 14, 2017, which is hereby incorporated by reference in its entirety.

FIELD OF THE INVENTION

This invention relates to the joining of quartz pieces, and to devices made of joined quartz pieces.

BACKGROUND

Quartz structures may be used in support of semiconductor processing and in other industrial applications. Prior methods for joining quartz pieces are costly and time intensive. Refractory materials, such as fused quartz plates and rods are welded using a heat source, such as a high power continuous wave carbon dioxide laser. Lasers have difficulty welding refractory materials due in part to the amorphous nature of the materials. Despite the potential usefulness to the semiconductor industry, laser fusing of quartz and other refractory materials remains largely unexplored. This is due in part to the unreliability and difficulty of creating full penetration welds in the refractory materials. Refractory materials include quartz, sapphire, rutile, and other refractory materials with a low thermal expansion coefficient. Generally, a weld of these materials requires substantial heat, which affects a larger area then would normally be desired. Furthermore, oxides that are generated during the welding process may contaminate the surface of the weld before the weld can cool down and solidify.

What is needed is a method of joining quartz pieces which overcomes the obstacles of prior joining methods.

SUMMARY OF THE INVENTION

Figure 1:
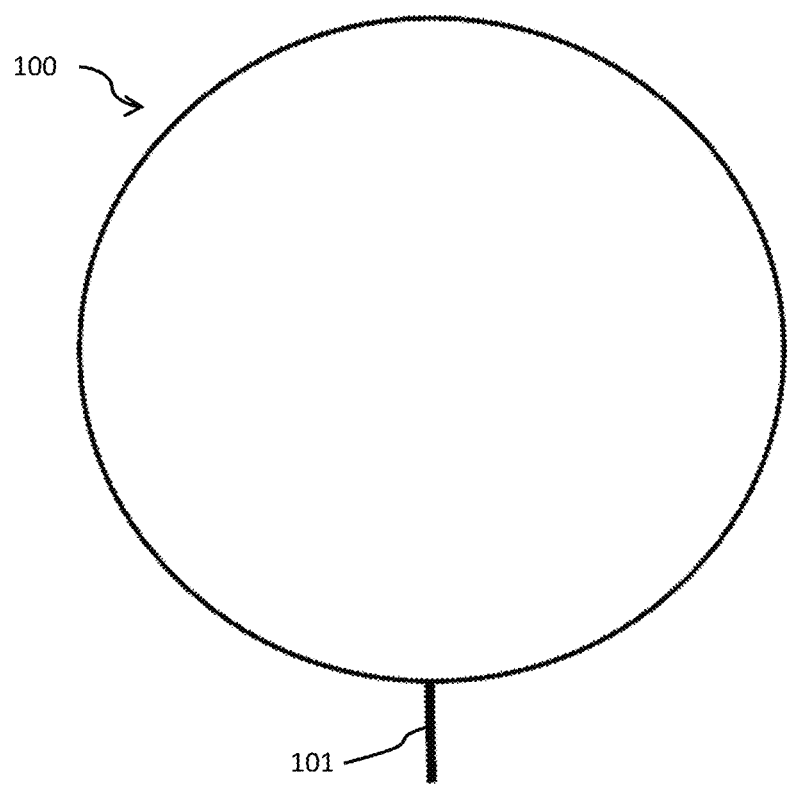
FIG. 1 is a top view of a 2 piece quartz electrode according to some embodiments of the present invention.

Quartz electrodes and other devices of joined quartz which may be used to support semiconductor processing. A method for joining quartz pieces using metallic aluminum as the joining element. The aluminum may be placed between two quartz pieces and the assembly may be heated in the range of 500 C to 650 C. The joining atmosphere may be non-oxygenated. A method for the joining of quartz pieces which may include barrier layers on the quartz pieces. The barrier layers may be impervious to aluminum diffusion and may be of a metal oxide or metal nitride. The quartz pieces with the barrier layers may then be joined at temperatures higher than 550 C and less than 1200 C. A device such as an RF antenna in support of semiconductor processing using joined quartz pieces wherein the aluminum joining layer which has joined the pieces and also functions as antenna electrode.

DETAILED DESCRIPTION

In some embodiments, two or more pieces of quartz may be joined with an aluminum layer deposed between the quartz surfaces to be joined. Heat is then applied, in either a vacuum environment, or in an atmosphere of an inert gas such as Argon, or in a reducing atmosphere such as Hydrogen. Heat is applied until the quartz pieces and the interposing aluminum layer(s) reach a temperature between 500 and 650 degrees centigrade.

Using the lower temperature process of between 500 and 650 degrees centigrade, there may be formed at the interface of the aluminum and the quartz an aluminate layer, such that a cross-section of quartz pieces joined in this manner would show quartz, aluminate, metallic aluminum, aluminate, and quartz. The metallic aluminum can be used to carry electrical current, or radio frequencies, or microwaves, or anything which can be carried by metallic aluminum.

Many types of apparatus can be made utilizing this method of joining quartz with aluminum. In some embodiments, a quartz electrode is made. In some embodiments, a quartz electrostatic chuck can be made. A quartz RF antenna, or a quartz microwave antenna can made. Large quartz assemblies can be made with multiple smaller pieces of quartz joined together with aluminum. Amorphous quartz may be used for plasma electrodes, RF antennae, and electrostatic chucks, or for other appropriate end uses. Crystalline quartz maybe used for sensors, oscillators, or for other appropriate end uses.

In some embodiments, the joining surface of each quartz piece is sputtered with aluminum to create an aluminum layer prior to the final joining step(s). In some embodiments, each sputter layer may be 25 microns thick. In some embodiments, each sputter layer may be in the range of 20-30 microns thick. In some embodiments, each sputter layer may be in the range of 10-50 microns thick. In some embodiments, each sputter layer may be greater than 10 microns thick. In some embodiments, the aluminum is vacuum deposited using sputtering, CVD, or evaporation processes onto the quartz pieces.

The joining layer may be of metallic aluminum of greater than 89% by weight in some aspects. The joining layer may be of metallic aluminum of greater than 98% by weight in some aspects. The joining layer may be of metallic aluminum of greater than 99% by weight in some aspects. In some aspects, the joining layer may be of metallic aluminum of greater than 99.99% by weight. In some aspects, the layers of sputtered aluminum on the joining surfaces of the quartz become the single joining layer. The joining temperature may be below the liquidus temperature of the joining layer material in some aspects. In some embodiments of the present invention, the joining layer not only joins the pieces, but then after joining performs an electrical function, such as being an RF antenna, a chucking electrode, a ground plane, or other function.

In some aspects, the joining occurs in a vacuum with a pressure lower than 1×10E-4 Torr. In some aspects, the joining occurs in a vacuum with a pressure lower than 1×10E-5 Torr. In some aspects, the joining occurs at atmospheric pressure in an inert gas such as argon. In some aspects, the joining occurs in an inert gas at a reduced pressure. The reduced pressure may be less than 100 Torr in some aspects. The reduce pressure may be less than 1 Torr in some aspects. In some aspects, the joining occurs at atmospheric pressure in hydrogen. In some aspects, the joining occurs in an hydrogen at a reduced pressure. The reduced pressure may be less than 100 Torr in some aspects. The reduce pressure may be less than 1 Torr in some aspects.

In some aspects, the joining process will be held at temperature for a dwell duration of 2 hours. In some aspects, the joining process will be held at temperature for a dwell duration in the range of 30 minutes to 3 hours. In some aspects, the joining process will be held at temperature for a minimum of 10 minutes. In some aspects, the joining process will be held at temperature for a dwell duration in the range of 60 minutes to 120 minutes.

In some aspects, the temperature for the joining process is 590 C. In some aspects, the temperature for the joining process is in the range of 590 C-610 C. In some aspects, the temperature for the joining process is in the range of 550 C-650 C. The selected temperature for the joining process takes into account a minimum temperature necessary to achieve joining, on the one hand, and a maximum temperature kept as low as possible to limit reactions occurring on the joining surfaces of the quartz pieces.

In some embodiments, the addition of a barrier material placed between the aluminum and the quartz surfaces is used. In some aspects temperatures great than 650 degrees centigrade can be used. A purpose of the barrier material is to control diffusion and chemical reactions between the quartz and the molten aluminum, and exemplary barrier materials are aluminum oxide, aluminum nitride, and other materials known to not diffuse with molten aluminum at temperatures greater than 650 and less than 1200 degrees centigrade. The barrier layer may be thin film sputtered metal oxide or metal nitride, such as aluminum nitride. In some aspects, the barrier layer presents an impervious barrier. In some aspects, the barrier layer presents a partly impervious barrier. In some embodiments, the barrier layer may be silicon.

Figure 2:
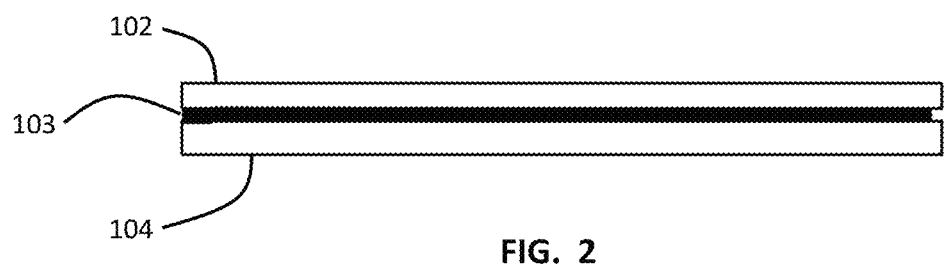
FIG. 2 is a side view of a 2 piece quartz electrode according to some embodiments of the present invention.

In an exemplary embodiment of a quartz device joined with processes as described herein, as seen in FIGS. 1 and 2, a 2 layer quartz electrode 100 has an electrical input lead 101. A quartz top layer 102 overlays a lower quartz layer 104. Between the top layer 102 and the lower layer 104 is a metal layer 103. The electrical input lead 101 is electrically coupled to the metal layer 103. The joining layer is used to join the top layer 102 to the lower layer 104, and then also functions as an electrode after joining. Although illustrated as a circular disc in this exemplary embodiment, the quartz device may be of another shape, such as a square, rectangle, as appropriate.

Figure 5:
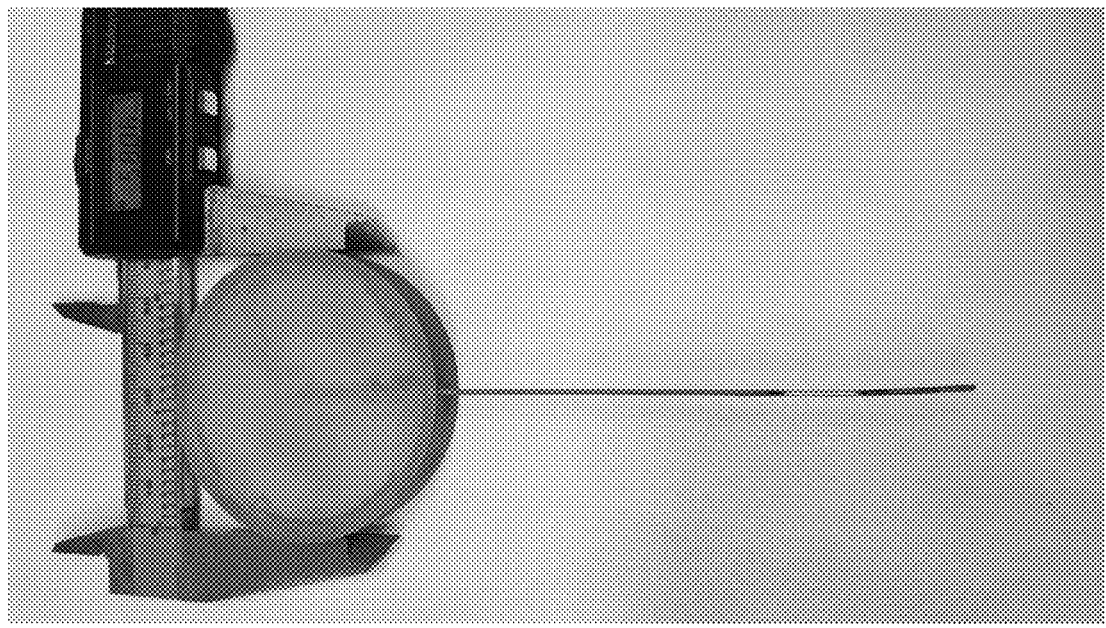
FIG. 5 is a photograph of a joined quartz structure according to some embodiments of the present invention.
Figure 6:
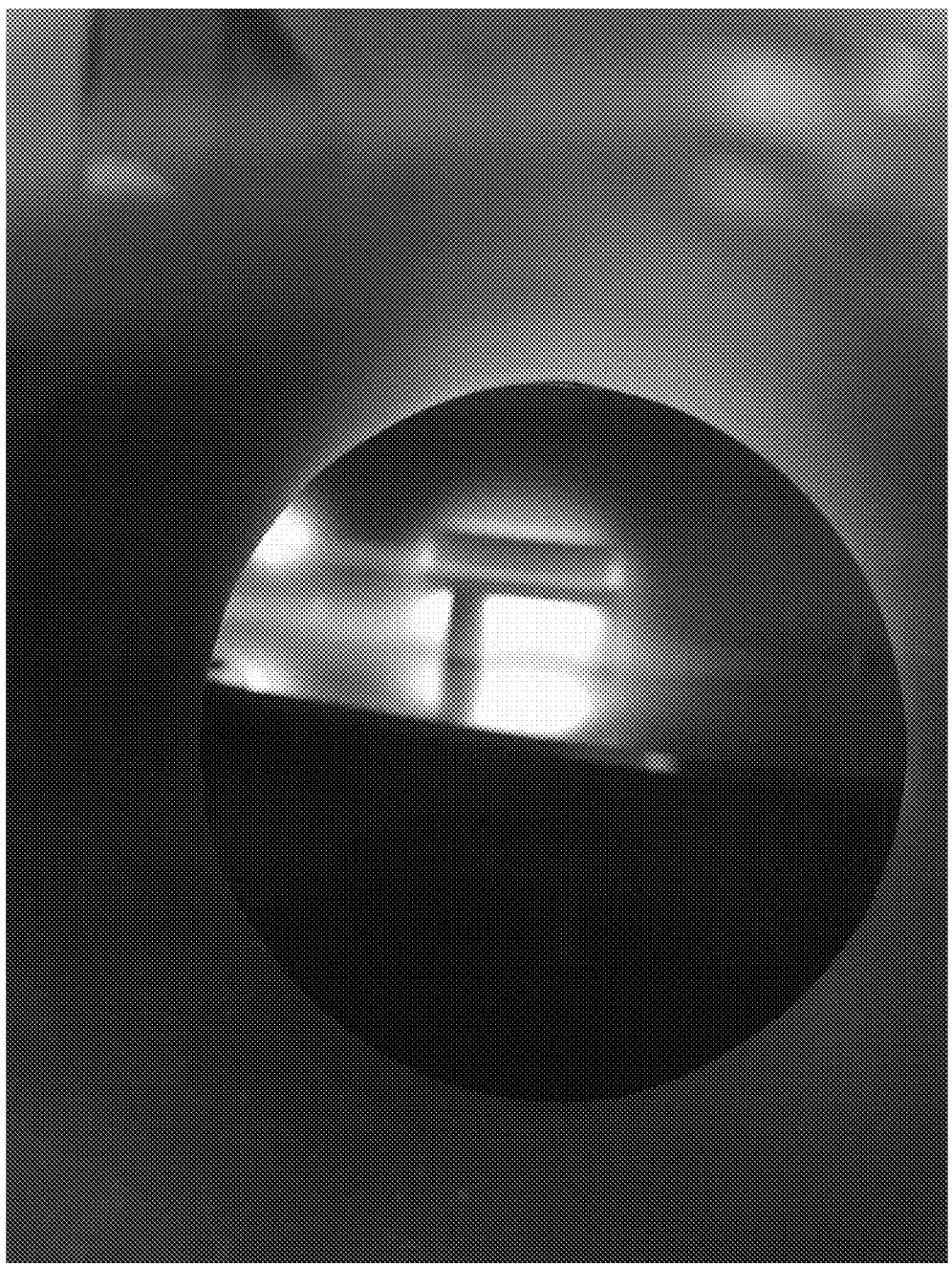
FIG. 6 is a photograph of the joined quartz structure in use as an RF antenna in a plasma application according to some embodiments of the present invention.

FIG. 5 is a photograph of a 2 layer quartz electrode according to some embodiments of the present invention. The upper quartz layer and the lower quartz layer are circular discs 58 mm in diameter, and each are 11 mm thick. Each quartz layer was sputtered with 25 microns of aluminum of greater than 99.99% aluminum by weight. The upper quartz layer and the lower quartz layer were joined to together at a temperature of 590 C at 90 minutes. The joining temperature was maintained while in a process oven held at 5×10E-6 Torr. FIG. 6 is a photograph illustrating the quartz electrode in use in a plasma firing mode. The electrical input lead is a Ni-200 wire 1 mm in diameter. One or both of the quartz layers may be grooved to allow for space for the electrical input lead between the upper and lower quartz layers. The pieces may be laid upon each other with just the force of gravity during joining in some aspects. The pieces may be stacked with an additional weight, or fixturing, during joining in some aspects.

Figure 3:
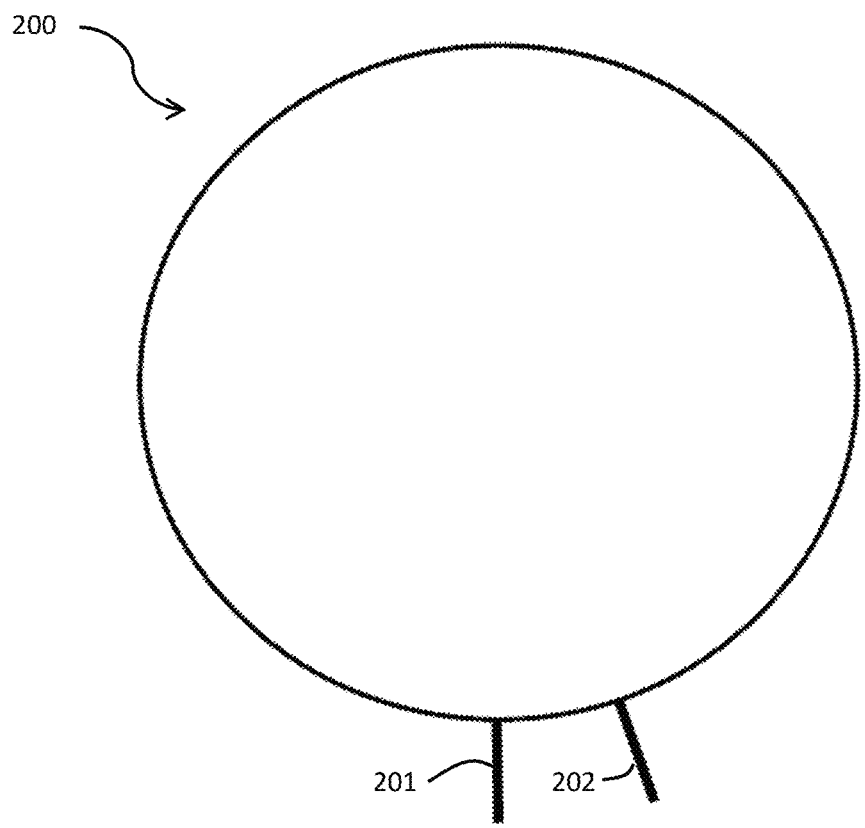
FIG. 3 is a top view of a 3 piece quartz electrode according to some embodiments of the present invention.
Figure 4:
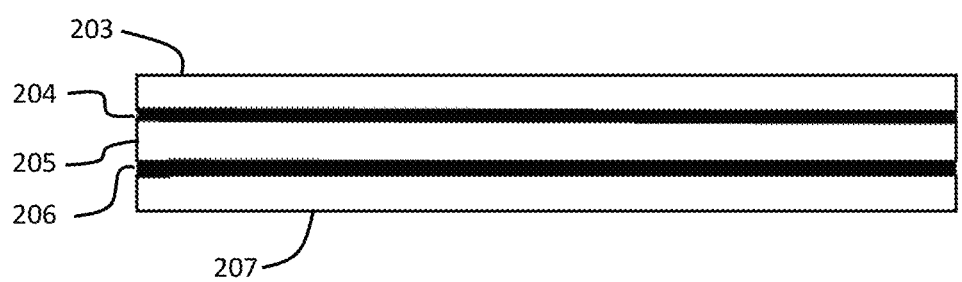
FIG. 4 is a side view of a 3 piece quartz electrode according to some embodiments of the present invention.

In an exemplary embodiment of a quartz device joined with processes as described herein, as seen in FIGS. 3 and 4, a 3 layer quartz electrode 200 has an electrical input lead 201 and a ground plane lead 202. A quartz top layer 203 overlays a middle quartz layer 205. Between the top layer 203 and the middle layer 205 is a metal layer 204. The electrical input lead 201 is electrically coupled to the metal layer 204. The quartz middle layer 205 overlays a bottom quartz layer 207. Between the middle layer 205 and the bottom quartz layer 207 is a metal layer 206. The ground plane lead 202 is electrically coupled to the metal layer 206. The joining layers are used to join the top layer 203 to the middle layer 205, and then the middle layer 205 to the bottom layer 206, and then also function as the electrode and the ground plane, respectively, after joining. Although illustrated in this exemplary embodiment as a stacked system, in some aspects the electrode and the ground plane may have other configurations, such as at an angle to each other, including at a right angle to each other.

In some embodiments of the present invention, as seen in FIG. 5, a quartz device is constructed of two quartz discs joined with a metallic aluminum joining layer. An electrical connection conductor is coupled to the aluminum joining layer. FIG. 6 illustrates the quartz device in use in a process chamber in a plasma process. The quartz electrode device seen is powered by a power source adapted for plasma generation, which may be RF Plasma Products, Inc., Model 20-S, for example. The ground plane for quartz device is below the quartz electrode in this illustrative embodiment.

Figure 7:
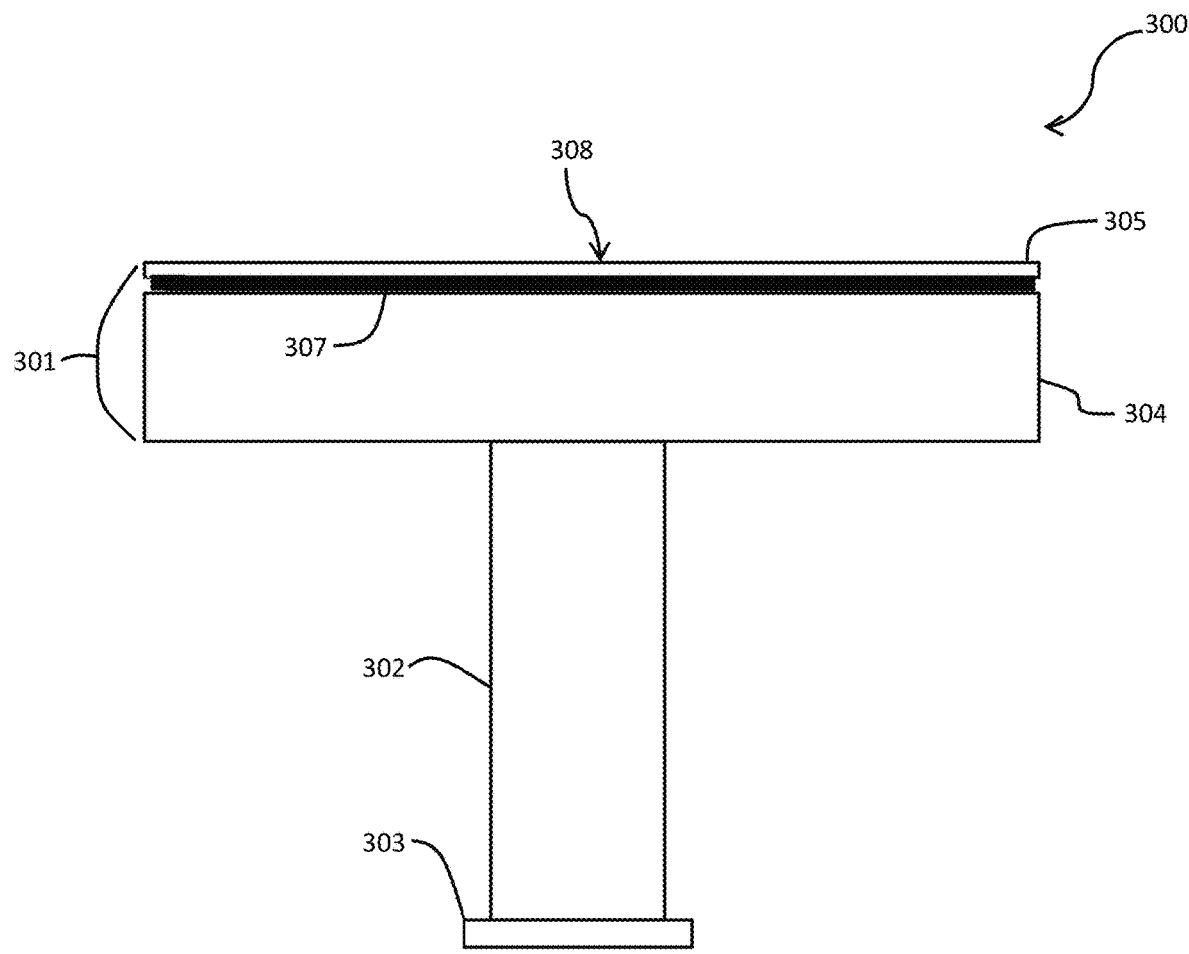
FIG. 7 is side view of a semiconductor substrate pedestal according to some embodiments of the present invention.

In some embodiments of the present invention, as seen in FIG. 7, an electrostatic chuck 300 is adapted to provide clamping. The electrostatic chuck 300 may have a plate assembly 301 joined to a shaft 302. The shaft 302 may be hollow and may have a mounting flange 303. The plate assembly 301 has a top surface 308 adapted to support a wafer or other substrate during processing. The top layer 305 may be joined to the joined to a lower plate portion 304 using a joining layer 306. An electrode 307 may reside between the top layer 305 and the lower plate portion 304. In some embodiments, the electrostatic chuck does not have a shaft.

In an exemplary embodiment of the electrostatic chuck 300, the top surface 308 and the lower plate portion may both be of quartz. The electrode 307 is the joining layer and is of aluminum. In some aspects, the electrical lead or leads to the electrode may come up to the electrode 307 from underneath the electrode, through the lower plate portion 304. The joining layer 306 is used to join the plate layers together, and then is used as an electrical component, as an RF antenna or chucking electrode.

In some embodiments, an aluminum alloy may be used instead of high purity aluminum as discussed above. An aluminum alloy may allow for lower joining temperatures, which may reduce the potential reactions on the joining surface of the quartz pieces being joined. In some aspects, the alloy may be aluminum alloyed with silicon. The alloy may be $Al(x)Si(1-x)$ where x is approximately 11.7% for a eutectic composition with a melting point of approximately 577 C. The joining temperature using such an alloy may be in the range of 450-550 C.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

What is claimed is:

1. A quartz device comprising:
an electrostatic chuck comprising a plate assembly with a top quartz layer, a first aluminum joining layer, and a first lower quartz layer,
wherein said first aluminum joining layer is directly disposed upon a joining surface of said top quartz layer and upon a joining surface of said first lower quartz layer, and wherein said first aluminum joining layer joins said top quartz layer to said first lower quartz layer and said electrostatic chuck is configured to clamp a wafer supported on a top surface of the top quartz layer.

2. The quartz device of claim 1 wherein said first aluminum joining layer comprises aluminum by greater than 99% by weight.

3. The quartz device of claim 1 further comprising a first electrical input lead, said first electrical input lead electrically coupled to said first aluminum joining layer, wherein said first aluminum joining layer is adapted to function as at least one of an RF electrode and a chucking electrode.

4. The quartz device of claim 3 wherein said first aluminum joining layer comprises aluminum by greater than 99.99% by weight.

5. The quartz device of claim 1 further comprising:
a second lower quartz layer; and
a second aluminum joining layer,
wherein said second aluminum joining layer is directly disposed upon a joining surface of said first lower quartz layer and upon a joining surface of said second lower quartz layer, and wherein said second aluminum joining layer joins said first lower quartz layer to said second quartz layer.

6. The quartz device of claim 5 further comprising;
a first electrical input lead, said first electrical input lead electrically coupled to said first aluminum joining layer, wherein said first aluminum joining layer is adapted to function as an RF electrode; and
a second electrical input lead, said second electrical input lead electrically coupled to said second aluminum joining layer, wherein said second aluminum joining layer is adapted to function as ground plane.

7. The quartz device of claim 6 wherein said first aluminum joining layer comprises aluminum by greater than 99% by weight, and wherein said second aluminum joining layer comprises aluminum by greater than 99% by weight.

8. The quartz device of claim 1 further comprising a shaft joined to the plate assembly.

9. The quartz device of claim 8, wherein the shaft is joined to the first lower quartz plate portion.

10. The quartz device of claim 8, wherein the shaft is hollow and is joined to the first lower quartz plate portion.

11. The quartz device of claim 1, wherein the first aluminum joining layer is a sputter layer comprising aluminum greater than 99.99% by weight.

12. The quartz device of claim 11, wherein the first aluminum joining layer has a thickness between 10-50 microns.

13. An electrostatic chuck comprising:
a plate assembly with a top quartz layer, an aluminum joining layer configured as a chucking electrode, and a lower quartz plate portion,
wherein said aluminum joining layer is directly disposed upon a joining surface of said top quartz layer and upon a joining surface of said lower quartz plate portion, and wherein said aluminum joining layer joins said top quartz layer to said lower quartz plate portion and said electrostatic chuck is configured to clamp a wafer supported on the top quartz layer.

14. The electrostatic chuck of claim 13 further comprising a hollow shaft joined to the lower quartz plate portion.

15. The electrostatic chuck of claim 13, wherein the aluminum joining layer is a sputter layer.

16. The electrostatic chuck of claim 13, wherein the aluminum joining layer has a thickness between 10-50 microns.

17. An electrostatic chuck comprising:
a plate assembly with a top quartz layer, an aluminum joining layer configured as a chucking electrode, and a lower quartz plate portion; and
a shaft joined to the lower quartz plate portion,
wherein said aluminum joining layer is directly disposed upon a joining surface of said top quartz layer and upon a joining surface of said lower quartz plate portion, and wherein said aluminum joining layer joins said top quartz layer to said lower quartz plate portion and said electrostatic chuck is configured to clamp a wafer supported on the top quartz layer.

18. The electrostatic chuck of claim 17, wherein the shaft is hollow.

19. The electrostatic chuck of claim 17, wherein the aluminum joining layer is a sputter layer comprising aluminum by greater than 99.99% by weight and having a thickness between 10-50 microns.

20. The electrostatic chuck of claim 17 further comprising an electrical input lead extending transversely through said lower quartz plate portion and electrically coupled to said aluminum joining layer.

* * * * *